United States Patent
Zhang et al.

(10) Patent No.: US 8,929,076 B2
(45) Date of Patent: Jan. 6, 2015

(54) HEAT-DISSIPATION STRUCTURE AND ELECTRONIC DEVICE USING THE SAME

(75) Inventors: Ling Zhang, Beijing (CN);
Chang-Hong Liu, Beijing (CN);
Shou-Shan Fan, Beijing (CN)

(73) Assignees: Tsinghua University, Beijing (CN);
Hon Hai Precision Industry Co., Ltd.,
New Taipei (TW)

( * ) Notice: Subject to any disclaimer, the term of this patent is extended or adjusted under 35 U.S.C. 154(b) by 195 days.

(21) Appl. No.: 13/589,733

(22) Filed: Aug. 20, 2012

(65) Prior Publication Data

US 2013/0163205 A1 Jun. 27, 2013

(30) Foreign Application Priority Data

Dec. 21, 2011 (CN) .......................... 2011 1 0432703

(51) Int. Cl.
*H05K 7/20* (2006.01)
*H01L 23/373* (2006.01)

(52) U.S. Cl.
CPC ........ *H01L 23/3733* (2013.01); *H05K 7/20472* (2013.01); *Y10S 977/742* (2013.01)
USPC ...... 361/706; 361/695; 361/679.47; 361/708; 977/742

(58) Field of Classification Search
CPC .......... H05K 7/20472; H05K 7/20481; H05K 7/2039–7/20518; G06F 1/20–1/203; H01L 23/373; H01L 23/3733; H01L 23/3735
USPC ......... 361/679.46–679.54, 688–723; 977/742
See application file for complete search history.

(56) References Cited

U.S. PATENT DOCUMENTS

| 7,947,145 | B2 * | 5/2011 | Wang et al. ................... 156/281 |
| 2004/0053053 | A1 | 3/2004 | Jiang et al. |
| 2006/0062944 | A1 | 3/2006 | Gardner et al. |
| 2007/0000642 | A1 | 1/2007 | Yamazaki et al. |
| 2008/0074847 | A1 * | 3/2008 | Sueoka et al. ................. 361/718 |
| 2009/0181239 | A1 * | 7/2009 | Fan et al. ...................... 428/327 |
| 2010/0044215 | A1 * | 2/2010 | Kim et al. ..................... 204/242 |
| 2010/0055023 | A1 * | 3/2010 | Kim et al. .................. 423/447.1 |
| 2010/0308489 | A1 | 12/2010 | Feng et al. |
| 2010/0310809 | A1 | 12/2010 | Jiang et al. |
| 2011/0300031 | A1 | 12/2011 | Kim et al. |
| 2012/0186851 | A1 * | 7/2012 | Winterhalter et al. .... 174/113 C |
| 2013/0160983 | A1 * | 6/2013 | Zhang et al. .................. 165/185 |
| 2014/0246811 | A1 * | 9/2014 | Wang et al. ................... 264/430 |

FOREIGN PATENT DOCUMENTS

| CN | 101480858 | 7/2009 |
| CN | 101905878 | 12/2010 |
| CN | 102180460 | 9/2011 |
| JP | 2005229100 A * | 8/2005 ............ H01L 23/373 |
| TW | I265612 | 11/2006 |
| TW | I306116 | 2/2009 |
| TW | 200909342 | 3/2009 |
| TW | I309461 | 5/2009 |

\* cited by examiner

*Primary Examiner* — Zachary M Pape
(74) *Attorney, Agent, or Firm* — Novak Druce Connolly Bove + Quigg LLP

(57) ABSTRACT

A heat-dissipation structure includes a first carbon nanotube layer and a metal mesh layer. The first carbon nanotube layer and the metal mesh layer are stacked on each other. The first carbon nanotube layer includes at least one first carbon nanotube paper. An electronic device applying the heat-dissipation structure is also disclosed.

16 Claims, 16 Drawing Sheets

HEAT-DISSIPATION STRUCTURE AND ELECTRONIC DEVICE USING THE SAME

CROSS-REFERENCE TO RELATED APPLICATIONS

This application claims all benefits accruing under 35 U.S.C. §119 from Chinese Patent Application No. 201110432703.8, filed on Dec. 21, 2011, in the China Intellectual Property Office. This application is also related to applications entitled, "METHOD FOR MAKING CARBON NANOTUBE PAPER", Ser. No 13/589,755 filed Aug. 20, 2012 and "HEAT-DISSIPATION STRUCTURE AND ELECTRONIC DEVICE USING THE SAME", Ser. No. 13/589,742 filed Aug. 20, 2012. The disclosures of the above-identified applications are incorporated herein by reference.

BACKGROUND

1. Technical Field

The present disclosure relates to heat-dissipation structures and electronic devices using the same and, more particularly, to a heat-dissipation structure employing carbon nanotube paper and an electronic device using the same.

2. Description of Related Art

As high power chips (such as CPU and DRAM) used in electronic and microelectronic devices are becoming increasingly dense and compact, there is a need for smaller and more efficient heat-dissipation structure due to the excessive on-chip heat generation. Take Intel Core i7 860 processor as example, whose thermal design power is 95 W, and its power density is higher than 30 $W/cm^2$. In comparison, a 60 W light bulb's power density is about 0.5 $W/cm^2$. Such power density leads to highly localized heating of chips in areas known as "hot spots." As the power density of chips increases, the number of "hot spots" on the surface of chips increases accordingly. Cooling chips are necessary to prevent degradation of the electronic and microelectronic devices and achieve the best possible device performance.

Some related art uses a heat-dissipation channel as the heat-dissipation solution, which includes heat-dissipation material film, thermal silicon grease, heat-dissipation material pipe and fan. The heat-dissipation material used in said heat-dissipation channel is mainly metal, such as copper and aluminum. However, using metal as heat-dissipation material in electronic devices has some disadvantages such as high material density and complicated manufacturing process.

Other related art has shown to use heat-dissipation material film as the heat-dissipation solution. The heat-dissipation material may be graphite-containing composites. However, using graphite-containing composites as heat-dissipation material in smart phone has drawbacks such as low thermal conductivity and uneven heat-dissipation.

What is needed, therefore, is to provide a heat-dissipation structure which has better heat-dissipation properties, and suitable for application in smaller and lighter electronic devices.

BRIEF DESCRIPTION OF THE DRAWINGS

Many aspects of the present disclosure can be better understood with reference to the following drawings. The components in the drawings are not necessarily to scale, the emphasis instead being placed upon clearly illustrating the principles of the present embodiments.

DETAILED DESCRIPTION

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean at least one.

Figure 1:
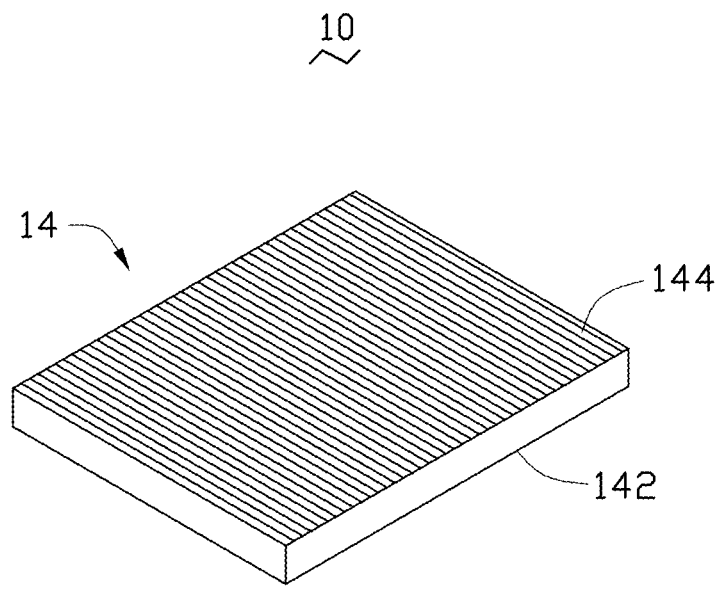
FIG. 1 is a schematic diagram of a heat-dissipation structure according to one embodiment.

A heat-dissipation structure 10 according to one embodiment is shown in FIG. 1. The heat-dissipation structure 10 includes a first carbon nanotube layer 14. The first carbon nanotube layer 14 has a first surface 142 and a second surface 144 opposing the first surface 142.

Figure 2:
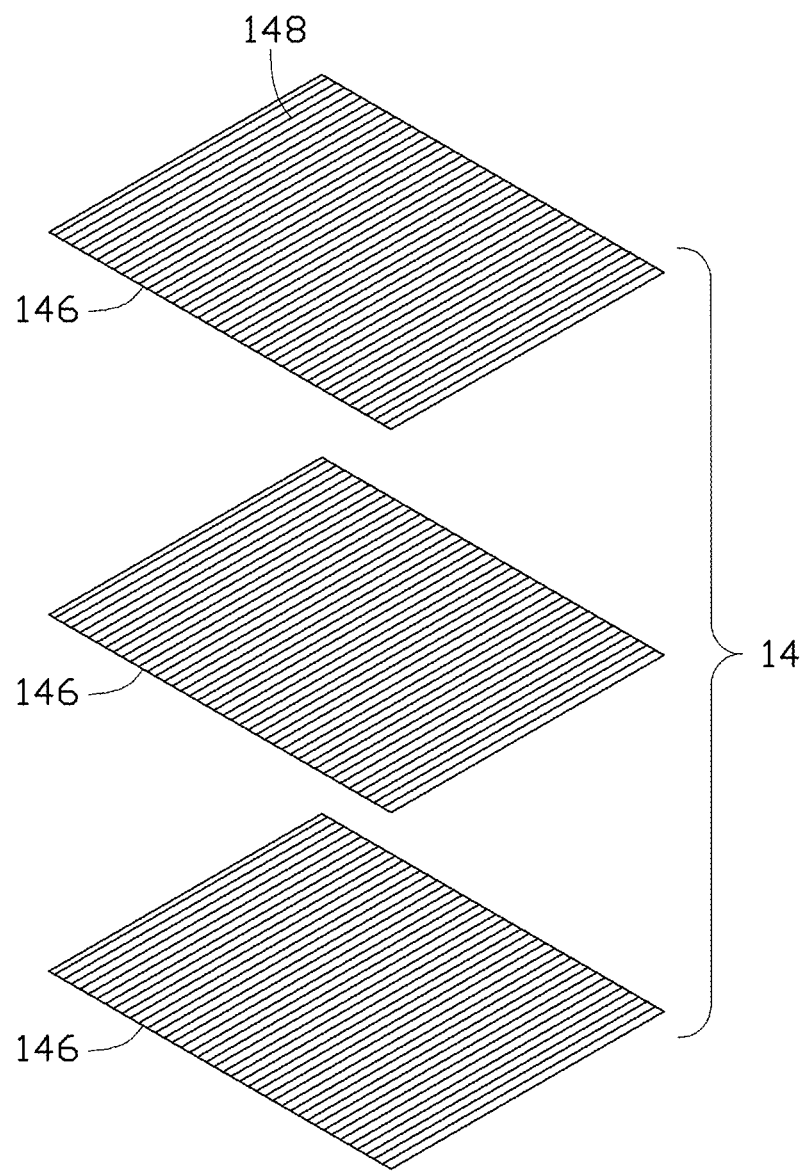
FIG. 2 is a schematic diagram of a first carbon nanotube layer having directional heat-dissipation function in the heat-dissipation structure of FIG. 1, in one embodiment.
Figure 3:
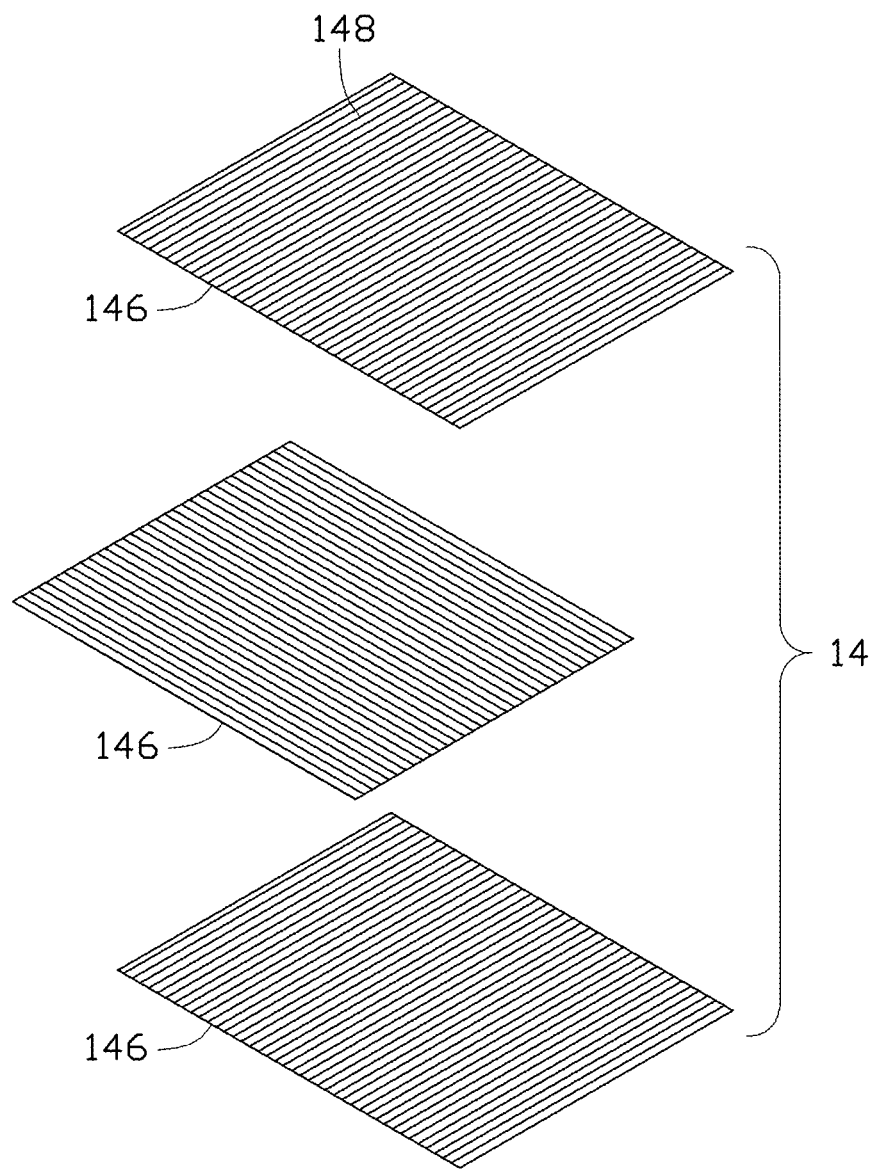
FIG. 3 is a schematic diagram of a first carbon nanotube layer having nondirectional heat-dissipation function in the heat-dissipation structure of FIG. 1, in another embodiment.

Referring to FIG. 2 and FIG. 3, two different structures of the first carbon nanotube layer 14 are illustrated. The first carbon nanotube layer 14 includes one or a plurality of first carbon nanotube papers 146. The first carbon nanotube paper 146 includes a plurality of carbon nanotubes 148. Adjacent carbon nanotubes 148 are joined end to end by van der Waals attractive force therebetween along a longitudinal direction of the carbon nanotubes 148. The plurality of carbon nanotubes 148 is arranged along a direction substantially parallel to the first surface 142 of the first carbon nanotube layer 14 in the first carbon nanotube paper 146. Thus, the first carbon nanotube paper 146 is an oriented carbon nanotube paper. The orientation of the first carbon nanotube paper 146 is along the axial direction of majority of the carbon nanotubes 148 of the first carbon nanotube paper 146. When the first carbon nanotube layer 14 includes a plurality of first carbon nanotube papers 146 stacked together closely, the orientations of the plurality of first carbon nanotube papers 146 can be same or different. Define α as an angle between the orientations of each two stacked first carbon nanotube papers 146 and 0°≤α≤90°.

The density of the first carbon nanotube paper 146 can range from about 0.3 g/cm$^3$ to about 1.4 g/cm$^3$. In one embodiment, the density of the first carbon nanotube paper 146 ranges from about 0.8 g/cm$^3$ to about 1.4 g/cm$^3$. In another embodiment, the density of the first carbon nanotube paper 146 ranges from about 1.2 g/cm$^3$ to about 1.3 g/cm$^3$. The thickness of the first carbon nanotube paper 146 can range from about 30 microns to about 120 microns, which can be selected according to the predetermined density.

The mechanical property, electrical property, as well as the thermal property of the carbon nanotubes 148 are all anisotropic due to its high aspect ratio. Take thermal property as example, the thermal conductivity along the axial direction of majority of the carbon nanotubes 148 is much higher than the thermal conductivity along the radial direction of majority of the carbon nanotubes 148. Similarly, the Young's modulus along the axial direction of majority of the carbon nanotubes 148 is much higher than the Young's modulus along radial direction of majority of the carbon nanotubes 148.

Figure 4:
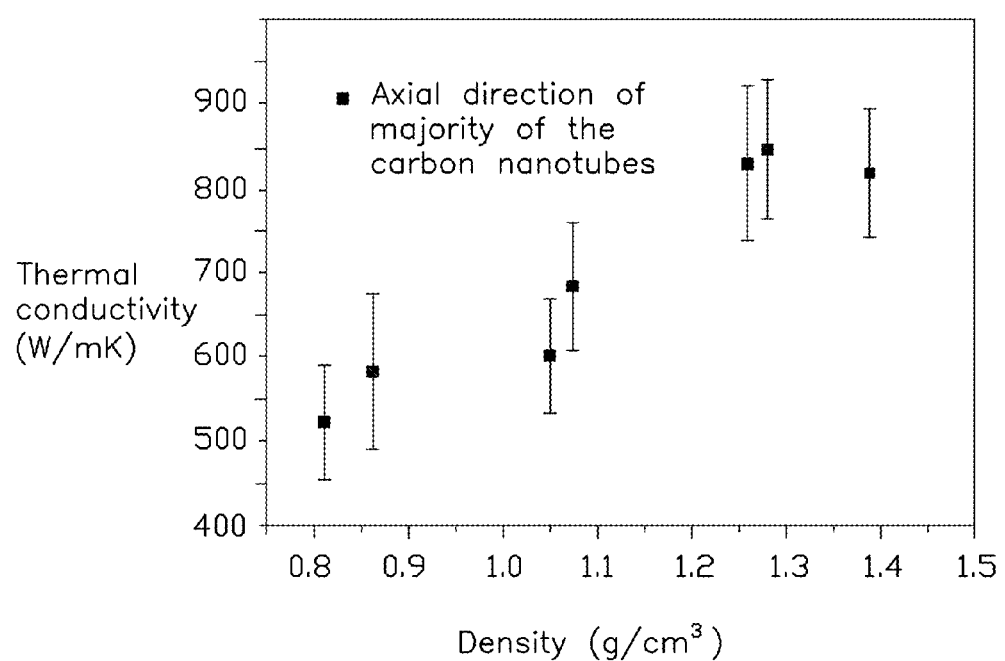
FIG. 4 is a graph showing a relationship between thermal conductivity along the axial direction of majority of the carbon nanotubes of a first carbon nanotube paper in the first carbon nanotube layer in FIG. 2, and density of the first carbon nanotube paper.
Figure 5:
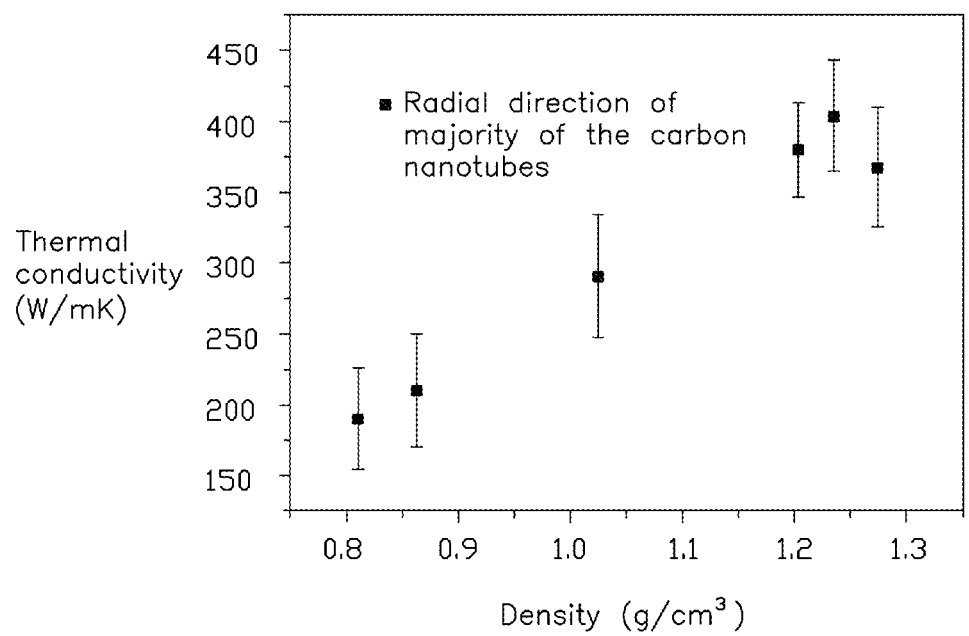
FIG. 5 is a graph showing a relationship between thermal conductivity along the radial direction of majority of the carbon nanotubes of a first carbon nanotube paper in the first carbon nanotube layer in FIG. 2, and density of the first carbon nanotube paper.

Referring to FIG. 4 and FIG. 5, a relationship between thermal conductivity and density of the first carbon nanotube paper 146 is illustrated. It can be seen that the thermal conductivity along the axial direction of majority of the carbon nanotubes 148 is more than two times higher than the thermal conductivity along the radial direction of majority of the carbon nanotubes 148, under a same density of the first carbon nanotube paper 146. The tendency of the thermal conductivity in FIG. 4 and the tendency of the thermal conductivity in FIG. 5 are similar. In FIG. 4, along the axial direction of majority of the carbon nanotubes 148, the highest thermal conductivity is about 800 W/mK while the density is about 1.3 g/cm$^3$. In FIG. 5, along the radial direction of majority of the carbon nanotubes 148, the highest thermal conductivity is about 400 W/mK while the density is about 1.25 g/cm$^3$. In comparison, the thermal conductivity of copper is 397 W/mK, and the thermal conductivity of aluminum is 237 W/mK.

Figure 6:
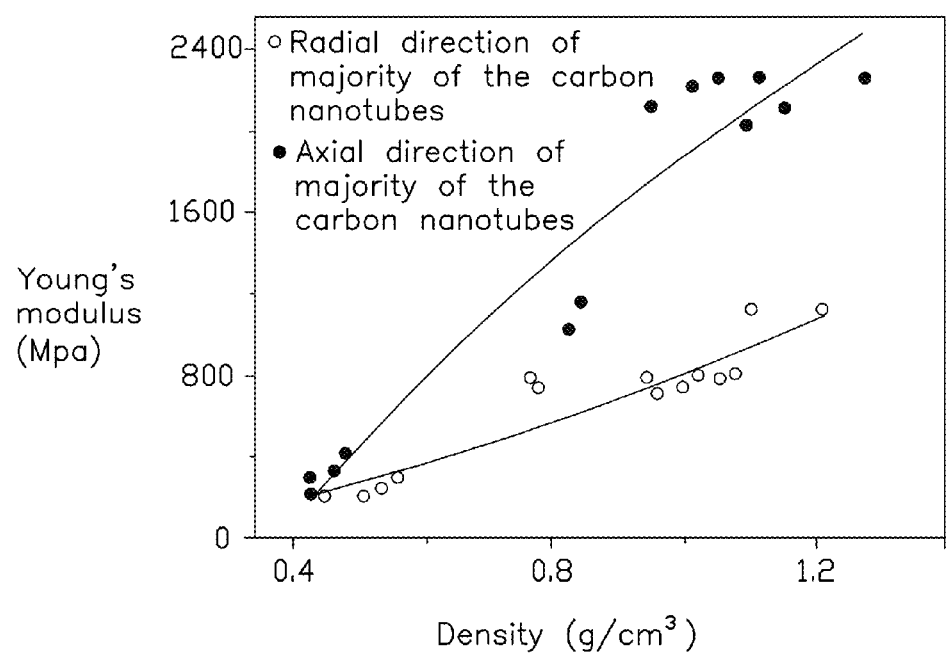
FIG. 6 is a graph showing a relationship between Young's modulus along both the axial and radial directions of majority of the carbon nanotubes of a first carbon nanotube paper in the first carbon nanotube layer in FIG. 2, and density of the first carbon nanotube paper.

Referring to FIG. 6, a relationship between Young's modulus and density of the first carbon nanotube paper 146 is illustrated. When the density of the first carbon nanotube paper 146 is relatively low (about 0.4 g/cm$^3$), the Young's modulus along the axial direction of majority of the carbon nanotubes 148 and the Young's modulus along the radial direction of majority of the carbon nanotubes 148 are both about 200 MPa. As the density of the first carbon nanotube paper 146 increases, both the Young's modulus along the axial direction of majority of the carbon nanotubes 148 and the Young's modulus along the radial direction of majority of the carbon nanotubes 148 increase gradually. The Young's modulus along the axial direction of majority of the carbon nanotubes 148 increases faster than the Young's modulus along the radial direction of majority of the carbon nanotubes 148. The highest Young's modulus along the axial of majority of the carbon nanotubes 148 is about 2400 MPa and the highest Young's modulus along radial direction of majority of the carbon nanotubes 148 is about 1200 MPa, while the density of the first carbon nanotube paper 146 is about 1.2 g/cm$^3$. In one embodiment, the Young's modulus along the axial of majority of the carbon nanotubes 148 in the first carbon nanotube paper 146 ranges from about 800 MPa to about 2400 MPa.

When the orientations of the plurality of stacked first carbon nanotube papers 146 in the first carbon nanotube layer 14 are same, the first carbon nanotube layer 14 have a directional heat-dissipation and heat-conducting function along the axial of majority of the carbon nanotubes 148. When the orientations of the plurality of stacked first carbon nanotube papers 146 are different, the first carbon nanotube layer 14 have a nondirectional heat-dissipation and heat-conducting function.

The first carbon nanotube paper 146 in one embodiment can be made by a method including:

(S1), providing a first roller and a second roller, wherein each roller has an axis, the first roller and the second roller are separately configured, the axis of the first roller and the axis of the second roller are parallel to each other;

(S2), providing at least one first carbon nanotube array and at least one second carbon nanotube array;

(S3), forming at least one first carbon nanotube film structure by drawing a plurality of carbon nanotubes from the at least one first carbon nanotube array and forming at least one second carbon nanotube film structure by drawing a plurality of carbon nanotubes from the at least one second carbon nanotube array;

(S4), winding the at least one first carbon nanotube film structure to the first roller and winding the at least one second carbon nanotube film structure to the second roller; and (S5), pressing the at least one first carbon nanotube film structure and the at least one second carbon nanotube film structure with each other, and forming two first carbon nanotube papers 146, one on the first roller and the other on the second roller.

The thermal contact resistance between the first carbon nanotube paper 146 and heat source will be very low due to the smooth surface of the first carbon nanotube paper 146. Additionally, the first carbon nanotube paper 146 is flexible and can be directly pasted to the surface of the heat source without adhesives.

Figure 7:
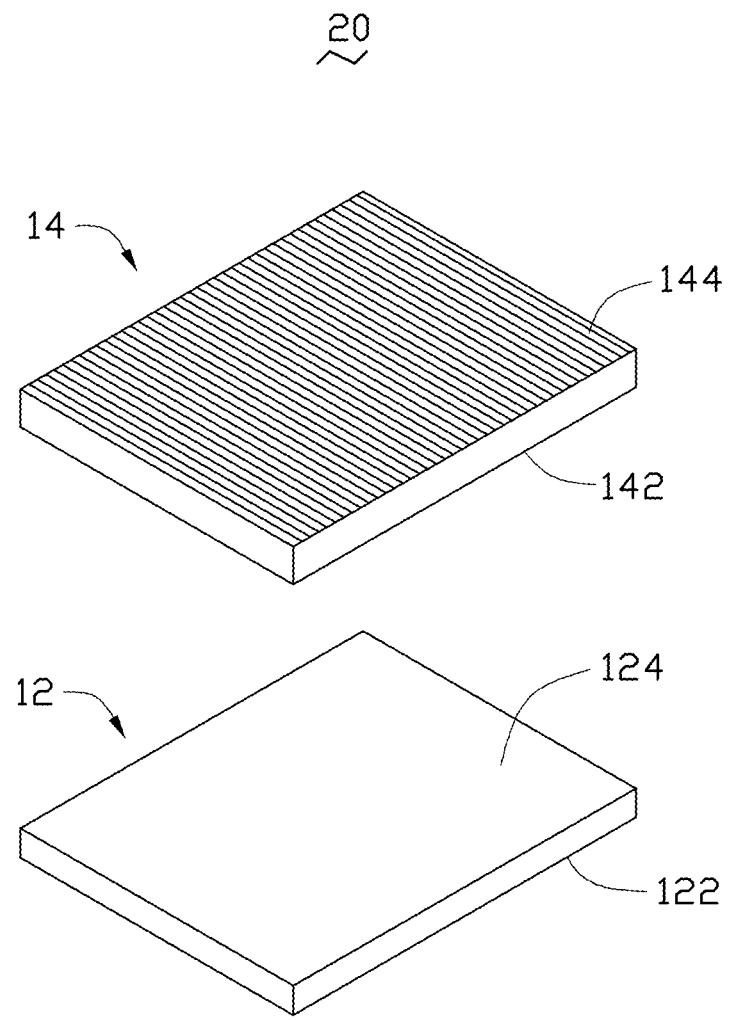
FIG. 7 is a schematic diagram of a heat-dissipation structure according to another embodiment.

Referring to FIG. 7, a heat-dissipation structure 20 according to another embodiment is shown. The heat-dissipation structure 20 includes a thermal interface material layer 12 and a first carbon nanotube layer 14. The thermal interface material layer 12 and the first carbon nanotube layer 14 are stacked together. The thermal interface material layer 12 contacts a heat source while the heat-dissipation structure 20 works.

The function of the thermal interface material layer 12 is to transfer heat from the heat source to the first carbon nanotube layer 14. The thermal interface material layer 12 can be a thermal silicon grease layer, a thermal silicone layer, a thermal glue layer, a thermal conductive tape or a carbon nanotube array. The thermal interface material layer 12 can also be a composite layer which includes a carbon nanotube array and thermal silicon grease located between the gaps of the carbon nanotubes in the carbon nanotube array. The carbon nanotubes in the carbon nanotube array are arranged along a direction parallel to the first surface 142 of the first carbon nanotube layer 14. In one embodiment, the thermal interface material layer 12 is a double-sided thermal conductive tape. When the heat-dissipation structure 20 is to be used, one side of the double-sided thermal conductive tape is fixed to the first surface 142 of the first carbon nanotube layer 14 and another side of the double-sided thermal conductive tape is fixed to the surface of the heat source. Thus, the heat-dissipation structure 20 can be conveniently applied in electronic devices.

The thickness of the thermal interface material layer 12 can be determined by the types of the thermal interface material. In one embodiment, the thickness of the thermal interface material layer 12 ranges from about 1 micron to about 300 microns. If the thermal interface material layer 12 includes a carbon nanotube array, the thickness can range from about 50 microns to about 150 microns.

Figure 8:
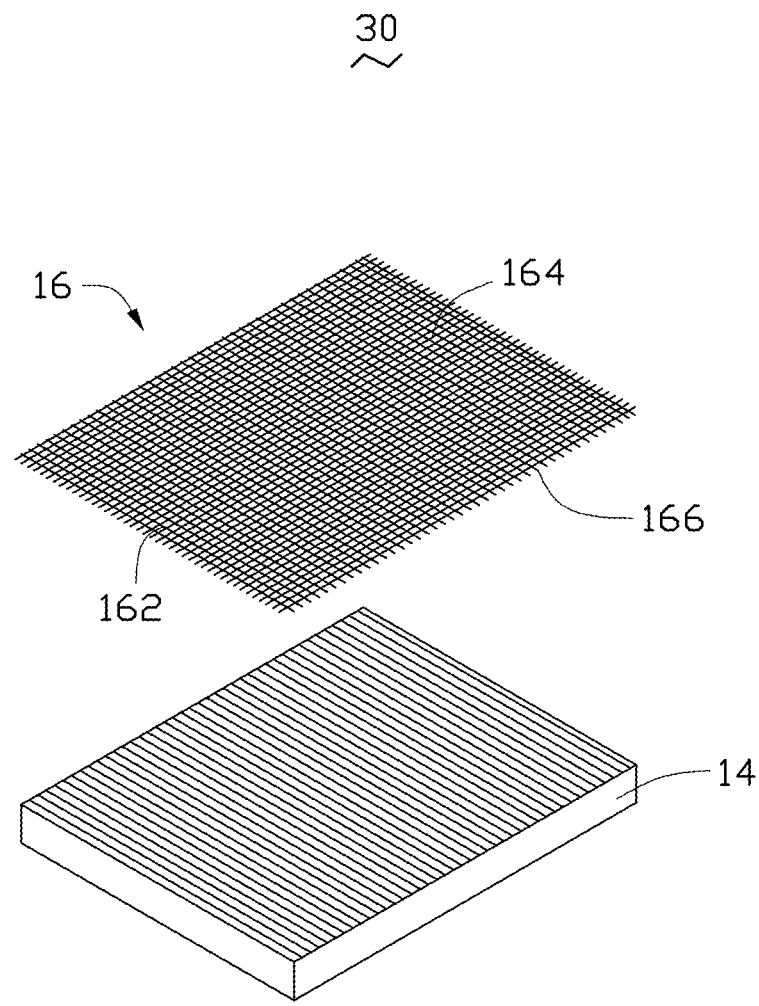
FIG. 8 is a schematic diagram of a heat-dissipation structure according to another embodiment.

Referring to FIG. 8, a heat-dissipation structure 30 according to another embodiment is shown. The heat-dissipation structure 30 includes a metal mesh layer 16 and a first carbon nanotube layer 14. The metal mesh layer 16 and the first carbon nanotube layer 14 are stacked together.

The metal mesh layer 16 has a bottom surface 162 and a top surface 164 opposite to the bottom surface 162. The metal mesh layer 16 includes a plurality of crossed metal wires 166 to form a grid. The metal mesh layer 16 can be made by weaving a plurality of metal wires 166, or by screen printing, spraying, pattern coating, etc. The line density of the metal mesh layer 16 can range from 5 lines per centimeter to 20 lines per centimeter. The diameter of the metal wire 166 can range from about 10 microns to about 50 microns. The metal wire 166 should be highly thermal conductive and supportive, such as copper and aluminum. The thickness of the metal mesh layer 16 can range from about 10 microns to about 100 microns.

The major function of the metal mesh layer 16 in the heat-dissipation structure 30 is to fix and support the first carbon nanotube layer 14. While disassembling and replacing the heat-dissipation structure 30, the metal mesh layer 16 can protect the first carbon nanotube layer 14 from damage.

The grid in the metal mesh layer 16 can be filled with thermal silicon grease. The grid can also be filled with a composite composed of a carbon nanotube array and thermal silicon grease located between the gaps of the carbon nanotubes in the carbon nanotube array.

In application, the first surface 142 of the first carbon nanotube layer 14 can be in contact with the metal mesh layer 16, and the second surface 144 of the first carbon nanotube layer 14 can be in contact with at least one heat source.

Figure 9:
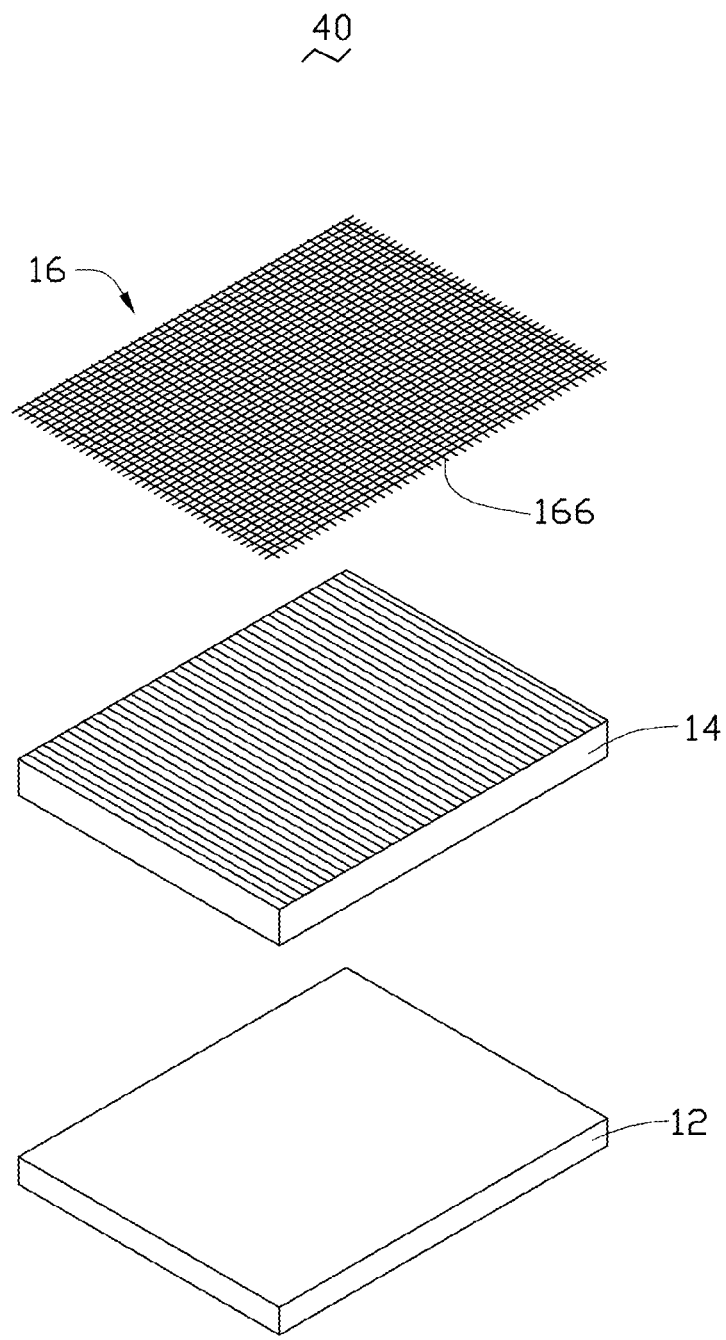
FIG. 9 is a schematic diagram of a heat-dissipation structure according to another embodiment.

Referring to FIG. 9, a heat-dissipation structure 40 according to another embodiment is shown. The heat-dissipation structure 40 includes a thermal interface material layer 12, a first carbon nanotube layer 14 and a metal mesh layer 16. The thermal interface material layer 12, first carbon nanotube layer 14 and metal mesh layer 16 are stacked together in series. Thus, the first carbon nanotube layer 14 is located between the thermal interface material layer 12 and the metal mesh layer 16.

Figure 10:
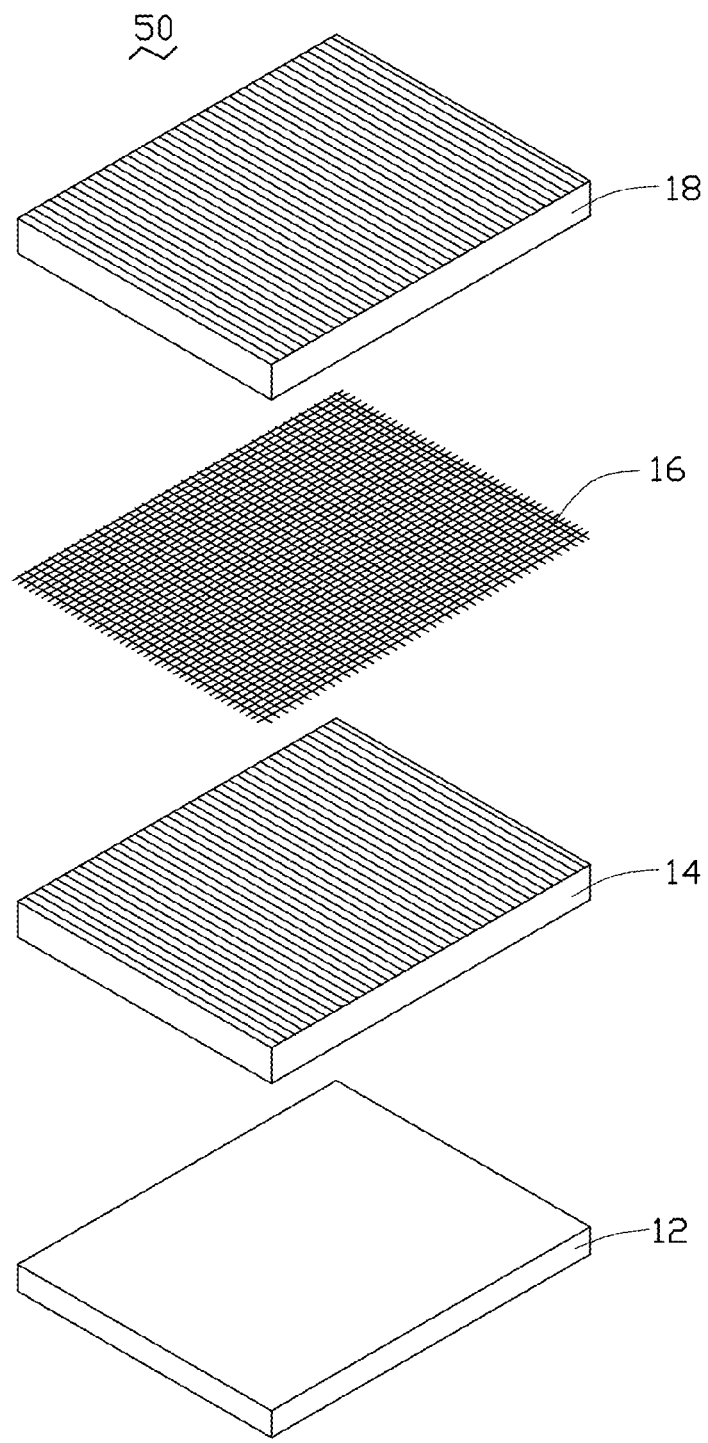
FIG. 10 is a schematic diagram of a heat-dissipation structure according to another embodiment.

Referring to FIG. 10, a heat-dissipation structure 50 according to another embodiment is shown. The heat-dissipation structure 50 includes a thermal interface material layer 12, a first carbon nanotube layer 14, a metal mesh layer 16, and a second carbon nanotube layer 18. The thermal interface material layer 12, first carbon nanotube layer 14, metal mesh layer 16, and second carbon nanotube layer 18 are stacked together in series.

The second carbon nanotube layer 18 includes one or a plurality of second carbon nanotube papers. If the second carbon nanotube layer 18 includes a plurality of second carbon nanotube papers, the plurality of second carbon nanotube papers are stacked on each other closely. The orientations of the plurality of second carbon nanotube papers can be same or different. Define α as an angle between the orientations of each two stacked second carbon nanotube papers and $0° \leq \alpha \leq 90°$.

The second carbon nanotube paper includes a plurality of carbon nanotubes 148. Adjacent carbon nanotubes 148 are joined end to end by van der Waals attractive force therebetween along a longitudinal direction of the carbon nanotubes 148. The plurality of carbon nanotubes 148 in the second carbon nanotube paper is arranged along a direction substantially parallel to the surface of the second carbon nanotube layer 18. Thus, the second carbon nanotube paper is an oriented carbon nanotube paper.

In application, the structures of the second carbon nanotube layer 18 and the first carbon nanotube layer 14 can be same or different.

When the orientations of the plurality of first carbon nanotube papers 146 in the first carbon nanotube layer 14 and the orientations of the plurality of second carbon nanotube papers in the second carbon nanotube layer 18 are the same, the heat-dissipation structure 50 has a directional heat-dissipation and heat-conducting function along the axial direction of majority of the carbon nanotubes 148 in the first carbon nanotube paper 146.

The first function of the second carbon nanotube layer 18 is to improve the heat-dissipation property and mechanical property of the heat-dissipation structure 50. The second function of the second carbon nanotube layer 18 is to coat the metal mesh layer 16, thus strengthens the supporting function of the metal mesh layer 16.

To further improve the supporting and the heat-conducting effects of the metal mesh layer 16, the metal mesh layer 16 can be filled with thermal silicon grease or a carbon nanotube array. The metal mesh layer 16 can also be filled with a composite comprising a carbon nanotube array and thermal silicon grease located between the gaps of the carbon nanotubes in the carbon nanotube array. The carbon nanotubes in the carbon nanotube array substantially perpendicular to the first surface 142 of the first carbon nanotube layer 14 and can directly contact with the first carbon nanotube layer 14 and the second carbon nanotube layer 18 simultaneously. While conducting heat from the first carbon nanotube layer 14 to the second carbon nanotube layer 18, the heat can conduct very fast along the axial of the carbon nanotubes in the carbon nanotube array.

Figure 11:
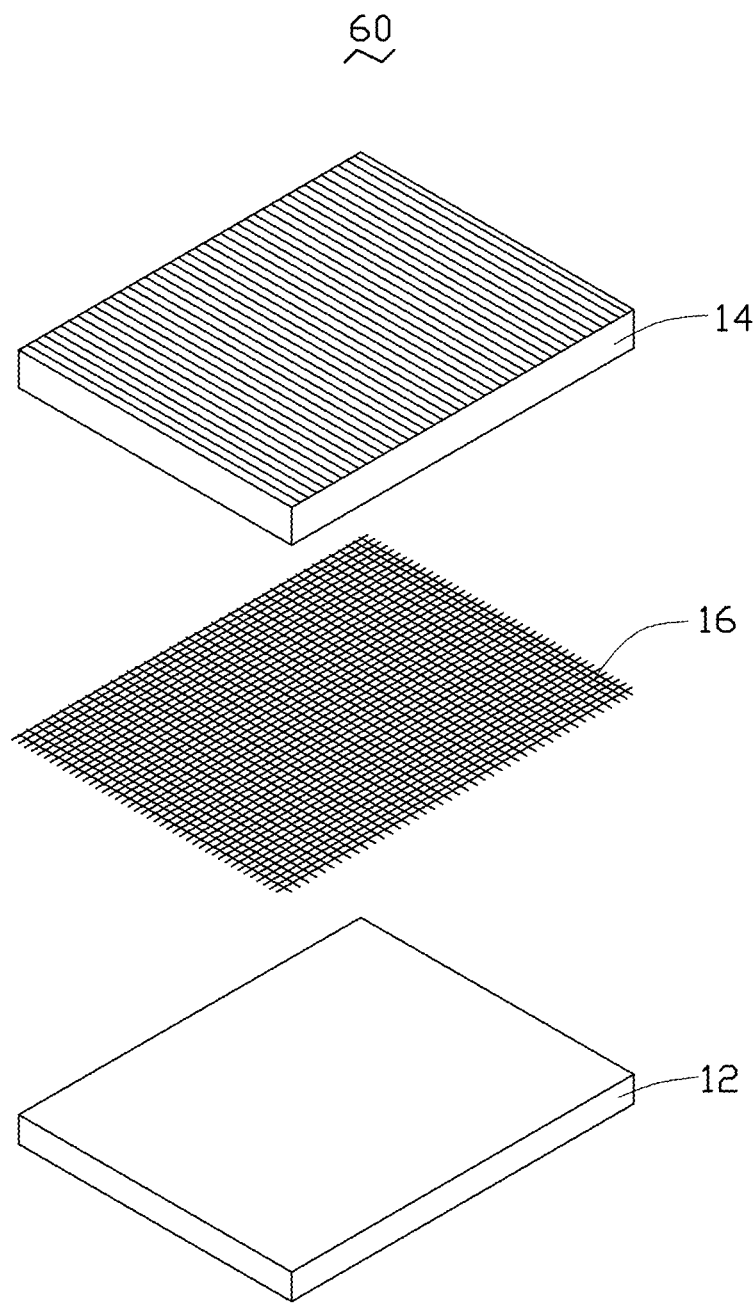
FIG. 11 is a schematic diagram of a heat-dissipation structure according to another embodiment.
Figure 16:
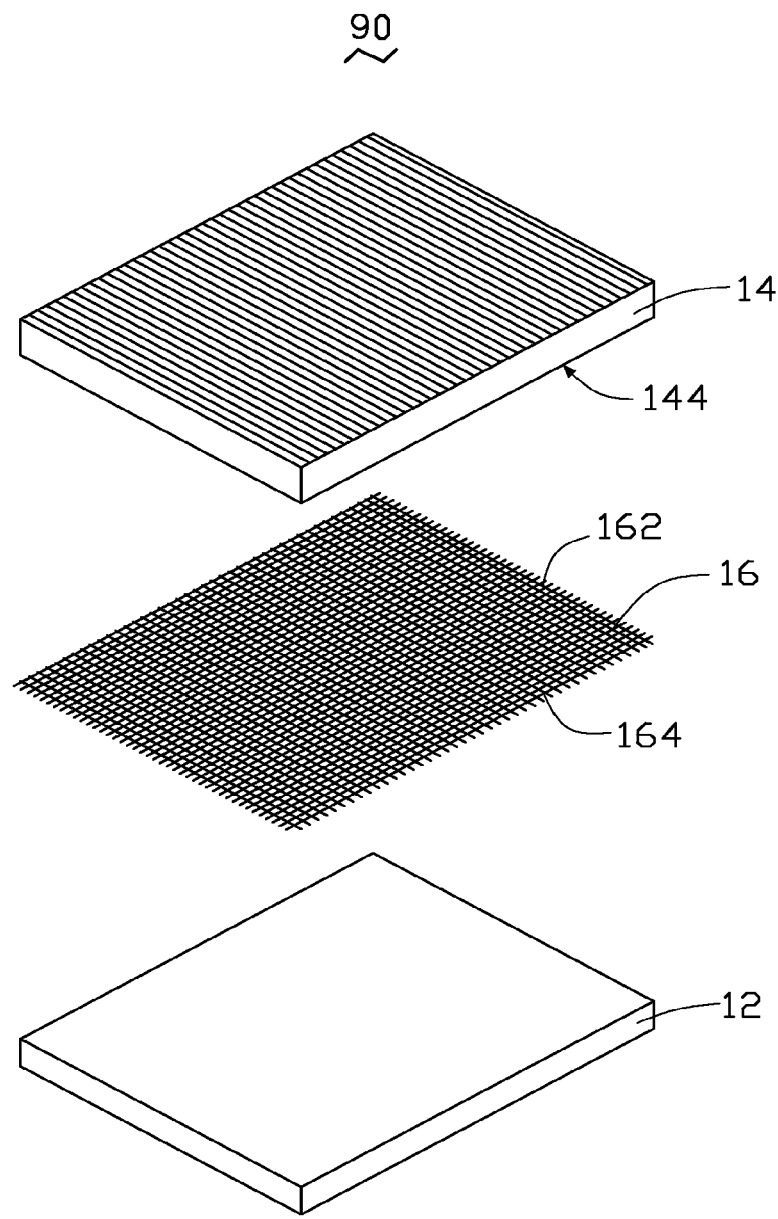
FIG. 16 is a schematic diagram of a heat-dissipation structure according to another embodiment.

Referring to FIGS. 11 and 16, a heat-dissipation structure 60 or 90 according to another embodiment is shown. The heat-dissipation structure 60 or 90 includes a thermal interface material layer 12, a metal mesh layer 16, and a first carbon nanotube layer 14. The thermal interface material layer 12, metal mesh layer 16 and first carbon nanotube layer 14 are stacked together in series. Thus, the metal mesh layer 16 is located between the thermal interface material layer 12 and the first carbon nanotube layer 14.

Figure 12:
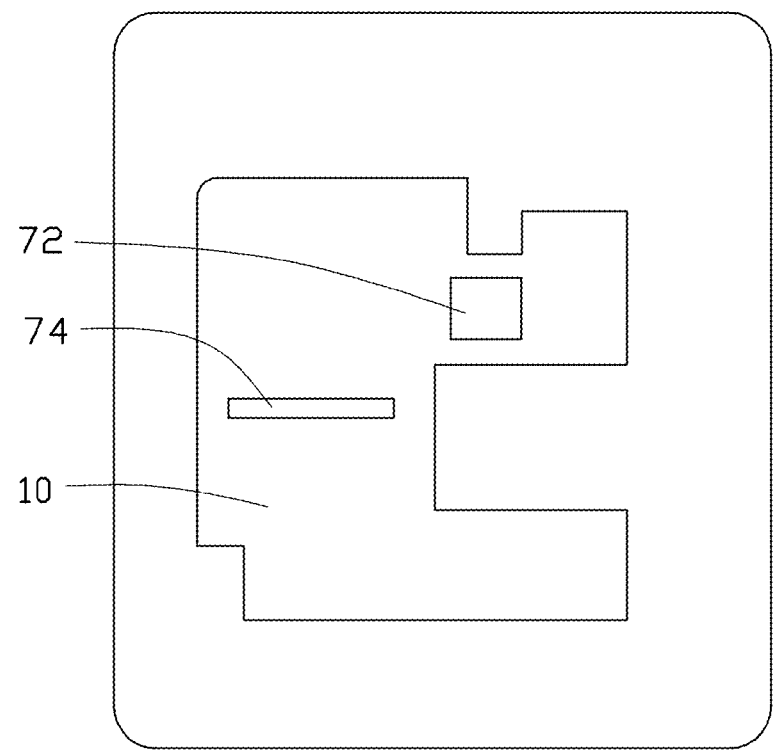
FIG. 12 is a schematic diagram of an electronic device having the heat-dissipation structure of FIG. 1 or FIG. 7.

Referring to FIG. 12, an electronic device 70 having the heat-dissipation structure 10 or 20 according to one embodiment is shown. The electronic device 70 can be smart phones, tablet PCs or other handheld devices. In one embodiment, the electronic device 70 includes a heat-dissipation structure 10, a CPU 72 and a memory chip 74. The heat-dissipation structure 10 contacts with the CPU 72 and the memory chip 74. While working, the heat generated by the CPU 72 and the memory chip 74 is firstly transferred to the first carbon nanotube layer 14 of the heat-dissipation structure 10 and then evenly dissipated to the whole body of the electronic device 70.

In another embodiment, the electronic device 70 includes a heat-dissipation structure 20, a CPU 72, and a memory chip 74. The heat-dissipation structure 20 contacts the CPU 72 and the memory chip 74. While working, the heat generated by the CPU 72 and the memory chip 74 is firstly conducted to the thermal interface material layer 12 of the heat-dissipation structure 20, then conducted to the first carbon nanotube layer 14 of the heat-dissipation structure 20, and finally dissipated to the whole body of the electronic device 70 evenly.

Figure 13:
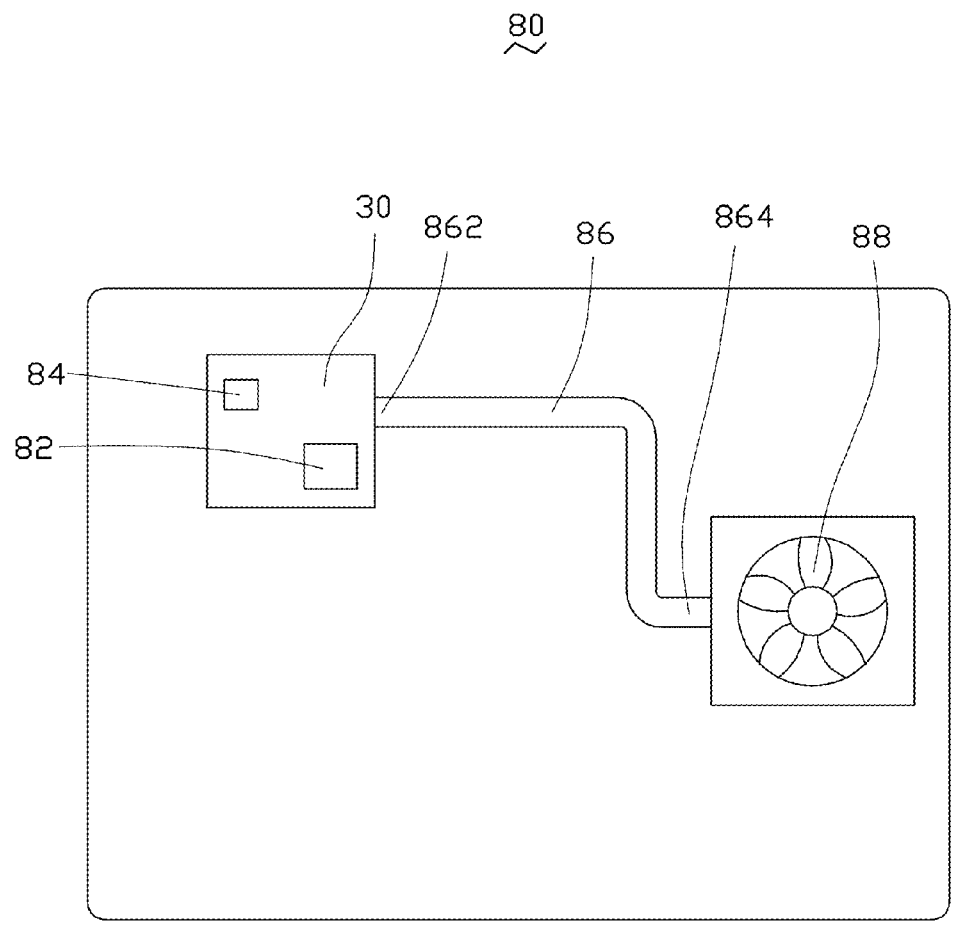
FIG. 13 is a schematic diagram of an electronic device having the heat-dissipation structure of FIG. 8 or FIG. 9 or FIG. 10 or FIG. 11.

Referring to FIG. 13, an electronic device 80 having the heat-dissipation structure 30, 40, 50 or 60 according to one embodiment is shown. The electronic device 80 can be notebook PCs or desktop PCs. The electronic device 80 includes a heat-dissipation structure 30, 40, 50 or 60, a CPU 82, a memory chip 84, a heat-conducting structure 86, and a fan 88. The heat-dissipation structure 30, 40, 50, or 60 contacts the CPU 82 and the memory chip 84. The heat-conducting structure 86 has a first end 862 and a second end 864 opposing the first end 862. The first end 862 is connected with the heat-dissipation structure 30, 40, 50, or 60 while the second end 864 is connected with the fan 88.

During operation, the heat generated by the CPU 82 or memory chip 84 is firstly transferred to the heat-dissipation structure 30. The heat absorbed by the heat-dissipation structure 30 is then transferred to the fan 88 via the heat-conducting structure 86. The fan 88 dissipates the heat out of the electronic device 80.

Figure 14:
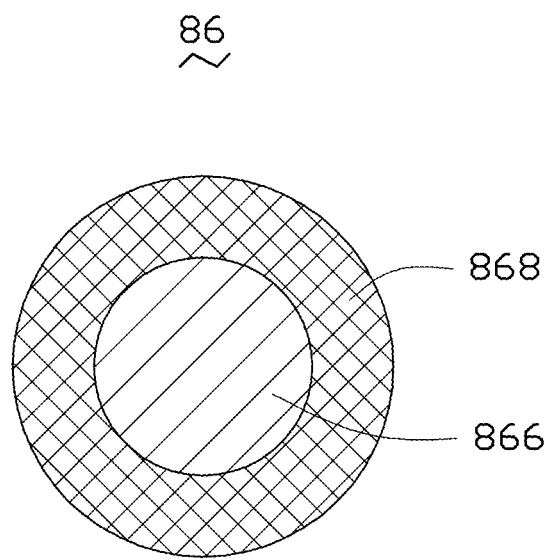
FIG. 14 is a schematic diagram of cross-section of a thermal-conducting structure in the electronic device of FIG. 13.

Referring to FIG. 14, a cross-section of the heat-conducting structure 86 in FIG. 13 is illustrated. The heat-conducting structure 86 is a coaxial cable which includes a metal core 866 and a third carbon nanotube layer 868 coated on the metal core 866. The metal core 866 can be made of copper, aluminum, copper alloys or aluminum alloys. The third carbon nanotube layer 868 is formed by rolling a third carbon nanotube paper, or by rolling a plurality of stacked third carbon nanotube papers. The third carbon nanotube paper includes a plurality of carbon nanotubes 148. Adjacent carbon nanotubes 148 are joined end to end by van der Waals attractive force therebetween along a longitudinal direction of the carbon nanotubes 148. The plurality of carbon nanotubes 148 in the third carbon nanotube paper is arranged along a direction substantially parallel to the surface of the third carbon nanotube layer. Thus, the third carbon nanotube paper is an oriented carbon nanotube paper. The axial direction of the heat-conducting structure 86 is same as the axial direction of majority of the carbon nanotubes 148 in the third carbon nanotube paper. Therefore, the heat-conducting structure 86 has a directional heat-conducting function along its axial direction.

Figure 15:
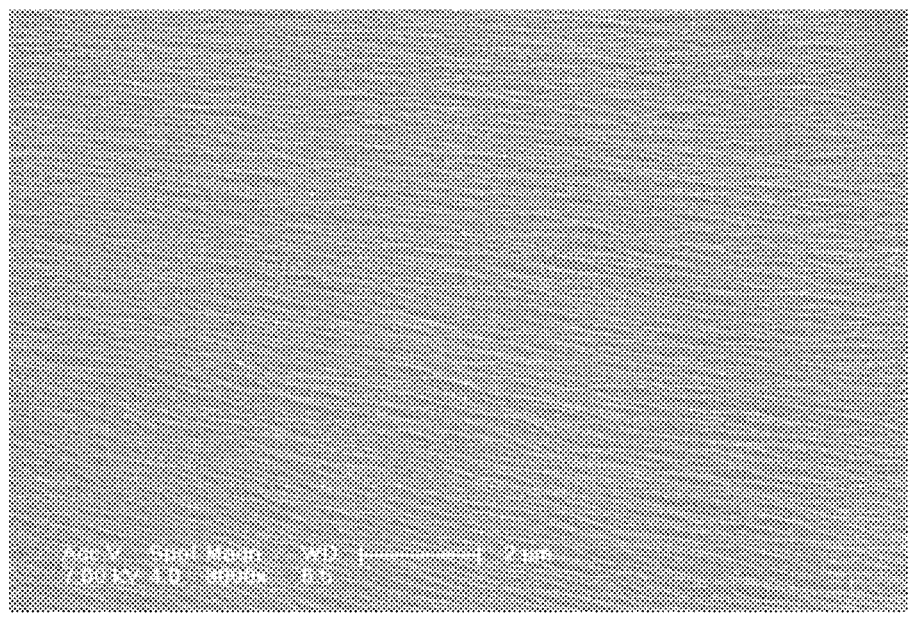
FIG. 15 is a scanning electron microscope image of a first carbon nanotube paper in the first carbon nanotube layer in FIG. 2 or FIG. 3.

Referring to FIG. 15, a SEM image of the first carbon nanotube paper 146 used in the heat-dissipation structures 10, 20, 30, 40, 50 and 60 is shown.

The heat-dissipation structure in current disclosure has advantages as follows: (a) the heat-dissipation structure is lightweight compared with metal-based heat-dissipation structures due to the low density of the carbon nanotube; (b) the heat-dissipation structure has improved heat-dissipation property compared with metal-based heat-dissipation structures due to the high thermal conductivity of the first carbon nanotube paper; (c) the heat-dissipation structure is small-sized and flexible, which is suitable to be used in various complex situation; (d) the heat-dissipation structure can be conveniently fixed to random surfaces of the heat source by thermal glue or thermal conductive tape; (e) the heat-dissipation structure has directional heat-dissipation and heat-conducting functions, which can significantly improve the heat-dissipation effect of the heat-dissipation structure.

It is to be understood that the above-described embodiment is intended to illustrate rather than limit the disclosure. Variations may be made to the embodiment without departing from the spirit of the disclosure as claimed. The above-described embodiments are intended to illustrate the scope of the disclosure and not restricted to the scope of the disclosure.

It is also to be understood that the above description and the claims drawn to a method may include some indication in reference to certain steps. However, the indication used is only to be viewed for identification purposes and not as a suggestion as to an order for the steps.

What is claimed is:

1. A heat-dissipation structure comprising: a metal mesh layer comprising a top surface and a bottom surface; a first carbon nanotube layer comprising a first surface and a second surface; wherein the metal mesh layer and the first carbon nanotube layer are stacked on each other, the bottom surface of the metal mesh layer contacts the second surface of the first carbon nanotube layer, and the first carbon nanotube layer comprises at least one first carbon nanotube paper comprising a plurality of carbon nanotubes, wherein all of the plurality of carbon nanotubes extend along a same direction; and a thermal interface material layer located on the first surface of the carbon nanotube layer, wherein the thermal interface material layer is a composite layer comprising thermal silicon grease and a carbon nanotube array comprising a plurality of carbon nanotubes and a plurality of gaps therebetween, and the thermal silicon grease is located in the plurality of gaps of the carbon nanotube array.

2. The heat-dissipation structure as claimed in claim 1, further comprising a second carbon nanotube layer located on the top surface of the metal mesh layer, and the second carbon nanotube layer comprises at least one second carbon nanotube paper.

3. The heat-dissipation structure as claimed in claim 2, wherein the second carbon nanotube paper comprises a plurality of carbon nanotubes, adjacent carbon nanotubes are joined end to end by van der Waals attractive force, the plurality of carbon nanotubes are arranged along a direction, and the direction is parallel to the first surface of the first carbon nanotube layer.

4. The heat-dissipation structure as claimed in claim 1, wherein a density of the first carbon nanotube paper ranges from about 0.3 g/cm$^3$ to about 1.4 g/cm$^3$.

5. The heat-dissipation structure as claimed in claim 1, wherein a thickness of the first carbon nanotube paper ranges from about 30 microns to about 120 microns.

6. The heat-dissipation structure as claimed in claim 1, wherein the thermal interface material layer comprises a material that is selected from the group consisting of thermal silicon grease layer, thermal silicone layer, thermal glue layer, thermal conductive tape and carbon nanotube array.

7. The heat-dissipation structure as claimed in claim 1, wherein the metal mesh layer comprises a plurality of crossed metal wires to form a grid, and a diameter of each of the plurality of crossed metal wires ranges from about 10 microns to about 50 microns.

8. The heat-dissipation structure as claimed in claim 7, wherein the grid is filled with a carbon nanotube array comprising a plurality of carbon nanotubes and a plurality of gaps therebetween, the plurality of gaps of the carbon nanotube array are filled with thermal silicon grease, and majority of the plurality of carbon nanotubes of the carbon nanotube array are perpendicular to the first surface of the first carbon nanotube layer.

9. The heat-dissipation structure as claimed in claim 1, wherein adjacent carbon nanotubes are joined end to end by van der Waals attractive force.

10. The heat-dissipation structure as claimed in claim 9, wherein the direction is parallel to the first surface of the first carbon nanotube layer.

11. The heat-dissipation structure as claimed in claim 1, wherein the first carbon nanotube layer comprises a plurality of stacked first carbon nanotube papers and the plurality of stacked first carbon nanotube papers have a same orientation.

12. A heat-dissipation structure comprising: a metal mesh layer; a first carbon nanotube layer; and a thermal interface material layer, wherein the metal mesh layer, the first carbon nanotube layer, and the thermal interface material layer are stacked on each other in series, the first carbon nanotube layer comprises at least one first carbon nanotube paper comprising a plurality of carbon nanotubes, wherein all of the plurality of carbon nanotubes extend along a same direction, and a density of each of the at least one first carbon nanotube paper ranges from about 0.3 g/cm3 to about 1.4 g/cm3, wherein the thermal interface material layer is a composite layer comprising thermal silicon grease and a carbon nanotube array comprising a plurality of carbon nanotubes and a plurality of gaps therebetween, and the thermal silicon grease is located in the plurality of gaps of the carbon nanotube array.

13. An electronic device comprising:
at least one heat source;
a heat-conducting structure comprising a metal core and a third carbon nanotube layer coated on the metal core; and
a heat-dissipation structure comprising a metal mesh layer and a first carbon nanotube layer, wherein the metal mesh layer comprises a top surface and a bottom surface, the first carbon nanotube layer comprises a first surface and a second surface, the metal mesh layer and the first carbon nanotube layer are stacked on each other, the bottom surface of the metal mesh layer contacts the second surface of the first carbon nanotube layer, and the first carbon nanotube layer comprises at least one first carbon nanotube paper comprising a plurality of carbon nanotubes arranged along a same direction.

14. The electronic device as claimed in claim 13, further comprising a fan, the heat-conducting structure has a first end and a second end, and the first end contacts the heat-dissipation structure while the second end contacts the fan.

15. The electronic device as claimed in claim 13, wherein the third carbon nanotube layer comprises at least one third carbon nanotube paper, and the third carbon nanotube layer is formed by rolling the at least one third carbon nanotube paper.

16. The electronic device as claimed in claim 15, wherein the third carbon nanotube paper comprises a plurality of carbon nanotubes, and majority of the plurality of carbon nanotubes of the third carbon nanotube paper are arranged along a same direction.

* * * * *